United States Patent
Hold et al.

(10) Patent No.: US 9,374,072 B2
(45) Date of Patent: Jun. 21, 2016

(54) POST FABRICATION TUNING OF AN INTEGRATED CIRCUIT

(71) Applicant: ARM Limited, Cambridge (GB)

(72) Inventors: Betina Hold, Austin, TX (US); Brian Cline, Austin, TX (US); George Lattimore, Austin, TX (US)

(73) Assignee: ARM Limited, Cambridge (GB)

( * ) Notice: Subject to any disclaimer, the term of this patent is extended or adjusted under 35 U.S.C. 154(b) by 27 days.

(21) Appl. No.: 14/268,336

(22) Filed: May 2, 2014

(65) Prior Publication Data

US 2014/0312956 A1  Oct. 23, 2014

Related U.S. Application Data

(63) Continuation-in-part of application No. 13/706,718, filed on Dec. 6, 2012, now Pat. No. 8,717,084.

(51) Int. Cl.
*H03K 5/133* (2014.01)
*H03K 5/13* (2014.01)

(52) U.S. Cl.
CPC .................................. *H03K 5/133* (2013.01)

(58) Field of Classification Search
CPC ......... H03K 5/00; H03K 5/133; H03K 17/00; H03K 17/04123; H03K 17/04126; H03K 17/04213; H03K 17/063; H03K 17/567; H03K 17/30; H03K 17/042; H03K 17/16; H03K 17/687; H03K 17/284
USPC .......................................................... 327/375
See application file for complete search history.

(56) References Cited

U.S. PATENT DOCUMENTS

| | | | |
|---|---|---|---|
| 6,166,577 A * | 12/2000 | Mizuno et al. ................. | 327/278 |
| 6,671,201 B2 | 12/2003 | Masuda | |
| 6,847,252 B1 | 1/2005 | Ono et al. | |
| 8,233,342 B2 | 7/2012 | Adams | |
| 8,363,453 B2 | 1/2013 | Arsovski et al. | |
| 2011/0001184 A1* | 1/2011 | Andrieu et al. ................. | 257/324 |
| 2012/0217561 A1* | 8/2012 | Khakifirooz et al. .......... | 257/314 |

OTHER PUBLICATIONS

UK Search Report dated May 9, 2014 in GB 1320890.5, 4 pages.
(Continued)

*Primary Examiner* — John Poos
*Assistant Examiner* — David Mattison
(74) *Attorney, Agent, or Firm* — Pramudji Law Group PLLC; Ari Pramudji

(57) ABSTRACT

An integrated circuit 2 includes a transistor 26 which has a normal switching speed arising during normal operations of that transistor that apply electrical signals within normal ranges. If it is desired to change the speed of operation of the transistor, then speed tuning circuitry 12 applies a tuning electrical signal with a tuning characteristic outside of the normal range of characteristics to the transistor concerned. The tuning electrical signal induces a change in at least one of the physical properties of that transistor such that when it resumes its modified normal operations the switching speed of that transistor will have changed. The tuning electrical signal may be a voltage (or current) outside of the normal range of voltages applied to the gate of a transistor so as to induce a permanent increase in the threshold of that transistor and so slow its speed of switching. Temperature of a transistor may also be controlled to induce a permanent change in performance/speed.

21 Claims, 7 Drawing Sheets

(56) References Cited

OTHER PUBLICATIONS

J. Wang et al, "Improving SRAM Vmin and Yield by Using Variation-Aware BTI Stress" CICC, 2010 IEEE, 4 pages.

F. Ahmed et al, "Reliable Cache Design with On-Chip Monitoring of NBTI Degradation in SRAM Cells using BIST" 28$^{th}$ IEEE VLSI Test Symposium, 2010, pp. 63-68.

A. Ricketts et al, "Investigating the Impact of NBTI on Different Power Saving Cache Strategies" 2010 EDAA, pp. 592-597.

M.A. Alam et al, "A comprehensive model for PMOS NBTI degradation: Recent progress" *Microelectronics Reliability*, vol. 47, 2007, pp. 853-862.

P. Singh et al, "Dynamic NBTI Management Using a 45nm Multi-Degradation Sensor" IEEE, 2010, 4 pages.

Z. Qi et al, "SRAM-Based NBTI/PBTI Sensor System Design" ACM DAC'10, Jun. 2010, pp. 849-852.

Kang et al, "Impact of Negative-Bias Temperature Instability in Nanoscale SRAM Array: Modeling and Analysis" *IEEE Transactions on Computer-Aided Design of Integrated Circuits and Systems*, vol. 26, No. 10, Oct. 2007, pp. 1770-1781.

U.S. Appl. No. 12/929,138 in the name of Schuppe et al., filed Jan. 3, 2011.

* cited by examiner

- BTI stands for Bias Temperature Instability
  - Due to reliability issues at Si-SiO$_2$ interface
  - Instability refers to gradual shift in transistor parameters with time

- Impact on transistor performance
  - $V_t$ increases
  - $I_{ds}$, $g_m$, $I_{off}$ decreases

- Temporal behaviour of BTI induced aging

- DC stress
  - Negative bias (stress)
    - $N_{TT}$ creation

- AC stress
  - Negative bias (stress)
    - $N_{TT}$ creation
  - Zero bias (recovery)
    - $N_{TT}$ Recovery - Bonds passivation

- AC stress leads to reduced degradation!
  - Degradation can be partially healed by a bias change

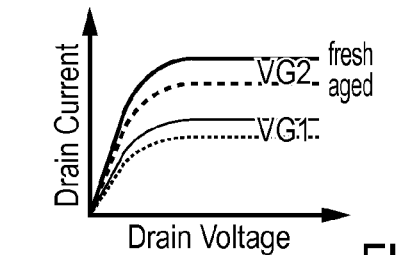

FIG. 9A

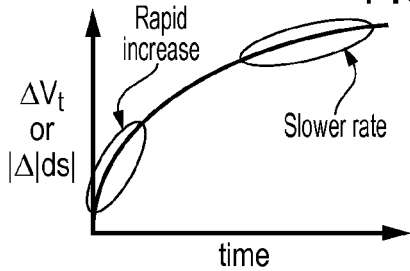

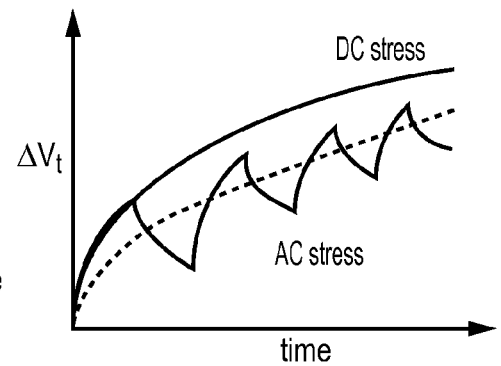

FIG. 9B

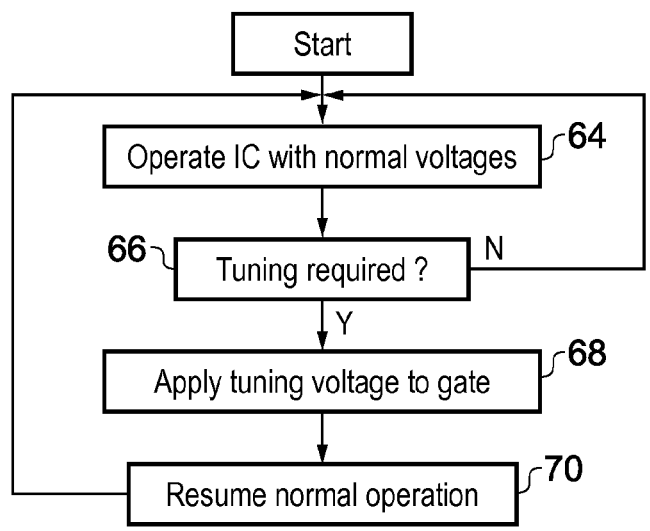

FIG. 11

POST FABRICATION TUNING OF AN INTEGRATED CIRCUIT

This is a continuation-in-part application of U.S. patent application Ser. No. 13/706,718 the content of which is in incorporated herein in its entirety by reference.

BACKGROUND OF THE INVENTION

1. Field of the Invention

This invention relates to the field of integrated circuits. More particularly, this invention relates to the tuning of the operation of integrated circuits after their manufacture.

2. Description of the Prior Art

It is known to provide integrated circuits with tuning mechanisms that may be used after manufacture, for example, to adjust the timing of certain control signals. As an example, a control signal may propagate through a delay line and the number of inverters in the signal path of that delay line may be changed so as to control the amount of delay applied to the control signal. Such tuning techniques are relatively coarse grained and are not applicable to all areas within a circuit where it might be desired to speed up or slow down the speed of operation.

SUMMARY OF THE INVENTION

Viewed from one aspect the present invention provides an integrated circuit comprising:

at least one transistor having a plurality of electrical connections and a normal switching speed controlled by one or more physical properties of said transistor, said normal switching speed arising during normal operations of said transistor that apply normal electrical signals with normal characteristics within respective normal ranges to at least some of said plurality of electrical connections of said transistor; and a performance characteristic tuner configured to apply during a tuning operation a tuning stimulus to said transistor permanently to change at least one of said one or more physical properties of said transistor that control said normal switching speed such that upon resuming modified normal operations with said normal electrical signals said transistor performs switching with a changed normal switching speed.

The present technique recognises that by applying tuning stimulus, such as a tuning electrical signal with characteristics outside of a normal range of characteristics, the speed of a transistor may be permanently changed as a result of an induced change in the physical properties of the transistors such that when normal processing is resumed after the tuning operation, the modified normal operations will proceed with the transistor performing with a changed switching speed. The tuning electrical signal (or other tuning stimulus) can be considered to stress the transistor and induce a permanent change in its speed characteristics. This technique for adjusting the speed of operation of a transistor may be applied widely throughout an integrated circuit in situations extending beyond those in which a delay line with a selectable delay might be useful.

Another form of possible tuning stimulus is temperature. Changing the temperature of a transistor to a given degree can produce a permanent change in the transistor speed. Surrounding transistors could be protected from also changing by virtue of their construction, e.g. thicker or additional oxide layers etc.

One way in which the tuning electrical signal can have characteristics outside of the normal characteristics is if the voltage of the tuning electrical signal is outside of a corresponding normal range of voltages for the transistor. Voltages outside of the normal voltage levels that are applied to the transistor can induce changes in physical properties of the transistor which in turn change the speed of operation of the transistor. What is the normal duration of a signal is influenced by the current operational mode of the integrated circuit, i.e. a signal with a normal duration in one mode may be applied for the same duration in another mode to cause a permanent change to tune the speed of the transistor.

Another way in which the tuning electrical signal can have characteristics outside of the normal range is if a voltage is applied for a duration longer than is normal. Such a longer than normal duration application of a voltage may induce a change in physical properties which in turn changes the speed of operation of the transistor.

It is possible that in some embodiments both the voltage level and the duration could be simultaneously altered to he outside of their normal ranges.

It will be appreciated that the physical properties that have changed can take a variety of different forms. One form of physical property that may be changed in a transistor using the present techniques is a switching threshold voltage of the transistor. Changing a switching threshold voltage changes the speed of operation of the transistor.

Depending upon the mechanism by which the physical properties of the transistor are changed, the tuning electrical signal could be applied at different ones of the connections to the transistor. In some embodiments, the tuning electrical signal is applied to the gate connection of the transistor. Applying a voltage to the gate of a transistor which is outside of the normal range can have the effect of changing the threshold voltage of the transistor such that the switching speed of the transistor is decreased.

In other embodiments the tuning electrical signal may be applied to the drain connection of a transistor. In some circumstances applying a tuning electrical signal with a voltage outside of the normal range of voltages to the drain connection can have the effect of increasing the switching speed of the transistor.

It is also possible that a tuning electrical signal could be applied to other of the connections of the transistors, e.g. a back bias connection, in different ways so as to change the speed characteristics of the transistor in a permanent manner and produce a desired change in the switching speed of the transistor. The present techniques are not limited to the use of any particular connection or terminal of the transistor to apply stress thereto to alter its properties.

The normal operations and the modified operations of the integrated circuit can take a variety of different forms. In some embodiments, the normal operation may be of an incorrect speed, but the integrated circuit still operate correctly, although with performance characteristics which could be improved by the use of the tuning operations of the present techniques. However, in other embodiments it may be that the normal operation of the transistor prior to the tuning operation is one in which the integrated circuit does not operate correctly (e.g. a critical timing constraint is not met) and that after the tuning operation, the modified normal operations are ones in which the transistor and the integrated circuit operate correctly (e.g. the critical timing constraint is now met).

In some embodiments the speed tuning circuitry may be configured to operate upon an initial use of the integrated circuit. After manufacture, the speed tuning circuit may perform self-test operations upon the integrated circuit to determine whether or not tuning operations are desirable. If tuning operations are desirable, then the tuning electrical signals may be applied to the appropriate transistors so as to adjust the speed characteristics of those transistors in the desired manner. In this way, the speed tuning circuit can be considered to operate upon a golden boot when the integrated circuit is first used.

In other embodiments the tuning circuit may be configured to operate periodically during use of the integrated circuit. Thus, when a predetermined time has elapsed or a predetermined trigger condition arises, the speed tuning circuitry may operate to determine whether or not tuning is appropriate and if appropriate apply the tuning electrical signal to one or more transistors so as to adjust their speed characteristics.

One way in Which the present technique may be used is when the integrated circuit includes a pair of transistors having at least partially matched switching speeds. The tuning electrical signal may be applied to a first of this pair so as to change its switching speed to more closely match the switching speed of a second of the pair. Better matching of the switching speeds of the pair of transistors may produce improved performance. An example of such a situation is when the pair of transistors are part of a sense amplifier within an integrated circuit memory. Balancing of the speed of operation of different transistors within a sense amplifier improves the reliability and potential speed of operation of the sense amplifier.

Another way in which the present techniques may be used to improve the performance of a sense amplifier within a memory is when the transistor is part of a current source. Such a current source will typically control the slew rate of the sense amplifier and changing the speed of operation of the transistor will in turn change the slew rate. Changing the slew rate to match a desired slew rate can improve the reliability and speed of operation of the memory.

In other embodiments the transistor may be part of a delay line and the tuning electrical signal used to change the switching speed of the transistor so as to change the delay timing of the delay line. This technique may be used to provide a fine grained tuning of the delay timing compared with alternative systems in which inverters are switched in and switched out of the delay line as entire entities.

Another example use of the present technique is within an integrated circuit that includes a transistor stack which is configured to generate an output signal which is either pulled up to a first voltage level or pulled down to a second voltage level in dependence upon an input signal. The transistor may be part of this transistor stack such that changing the switching speed of the transistor changes at least one of the speed at which the output signal is pulled up or pulled down. Adjusting the speed with which the output signal is generated can influence the timing of signals within the integrated circuit in a manner which can improve reliability or otherwise improve the performance of the integrated circuit.

It is possible in some embodiments that the speed tuning circuitry may apply the tuning electrical signals through normal signal paths which lead to the transistor electrical connections. However, in other embodiments the speed tuning circuitry may include a multiplexer coupled to the connection (or connections) of the transistor via which the tuning electrical signal is applied and used to switch either the tuning electrical signal or the normal electrical signal to that connection depending upon whether tuning operation or normal operation is to be performed.

Another example use of the present technique is within an integrated circuit that includes a signal path that is susceptible to a race condition error. In this situation, a transistor within this path may have its speed of switching adjusted using the tuning electrical signal so as to suppress occurrence of the race condition if this is found to arise in practice for the particular integrated circuit concerned.

Viewed from another aspect the present invention provides an integrated circuit comprising:

at least one transistor means for performing a switching operation, said transistor means having a plurality of electrical connection means for connecting electrical signals and a normal switching speed controlled by one or more physical properties of said transistor means, said normal switching speed arising during normal operations of said transistor means that apply normal electrical signals with normal characteristics within respective normal ranges to at least some of said plurality of electrical connection means of said transistor means; and speed tuning means coupled to said transistor means for applying during a tuning operation a tuning stimulus to said transistor permanently to change at least one of said one or more physical properties of said transistor means that control said normal switching speed such that upon resuming modified normal operations with said normal electrical signals said transistor means performs switching with a changed normal switching speed.

Viewed from a further aspect the present invention provides a method of tuning operation of an integrated circuit including at least one transistor having a plurality of electrical connections and a normal switching speed controlled by one or more physical properties of said transistor, said normal switching speed arising during normal operations of said transistor that apply normal electrical signals with normal characteristics within respective normal ranges to at least some of said plurality of electrical connections of said transistor, said method comprising the step of:

applying during a tuning operation a tuning stimulus to said transistor permanently to change at least one of said one or more physical properties of said transistor that control said normal switching speed such that upon resuming modified normal operations with said normal electrical signals said transistor performs switching with a changed normal switching speed.

The above, and other objects, features and advantages of this invention will be apparent from the following detailed description of illustrative embodiments which is to be read in connection with the accompanying drawings.

BRIEF DESCRIPTION OF THE DRAWINGS

FIGS. 9A and 9B are graphs schematically illustrating how threshold voltage is changed by application of a tuning electrical signal;

FIG. 11 is a flow diagram schematically illustrating the use of the present techniques to adjust the speed of operation of the transistor;

DESCRIPTION OF THE EMBODIMENTS

Figure 1:
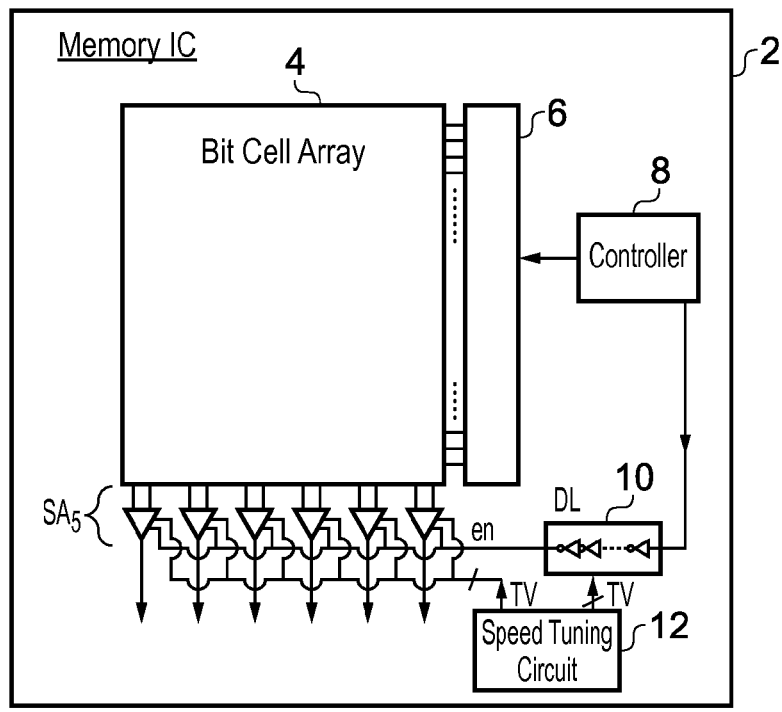
FIG. 1 schematically illustrates a memory integrated circuit.

FIG. 1 schematically illustrates an integrated circuit in the form of a memory 2. The memory includes a bit cell array 4, a row decoder 6 and sense amplifiers SA. A timing controller 8 generates timing signals which control the row decoder and, via a delay line 10, the enable signal (en) supplied to the sense amplifiers SA for reading the bit line pairs. Speed tuning circuitry 12 is coupled to both the delay line 10 and the sense amplifiers SA to apply a tuning voltage to transistors within the delay line 10 or the sense amplifiers SA so as to change their switching speed.

The normal operation of the memory 2 will use voltages for switching the gates of transistors within the sense amplifiers SA and the delay line 10 that are within a normal range of voltages. If the change in the speed of switching of any of those transistors is desired then the speed tuning circuit 12 during a tuning operation applies a tuning voltage outside of this normal range to the transistors so as to induce a change in one or more of the properties of those transistors that in turn changes the speed of operation of the transistors on a permanent basis (or at least semi-permanent as some ageing may occur that relaxes the change). The tuning voltage may he applied to the gate of the transistor so as to change its switching threshold voltage. In particular, a tuning voltage outside of the normal range will induce a permanent increase in the switching threshold voltage which in turn slows down the operation of the transistor. A transistor with a higher threshold voltage will typically switch more slowly than a similar transistor with a lower threshold voltage (and the switching currents will also be lower). In other embodiments, the tuning electrical signal, such as a tuning voltage, may be applied to the drain of a transistor. Applying such an out-of-range voltage to the drain of the transistor can induce an increase in its speed. Such speed increases are typically less permanent than those associated with changes in switching threshold voltage induced by out-of-range gate voltage application.

Out-of-range currents can also be used to cause permanent changes, e.g. ramping up a voltage quickly will give a high current compared to ramping up the voltage more slowly. High currents induce effects such as carrier injection, which can induce some damage in the transistors at both oxide and drain terminals and thereby cause a permanent change in behaviour.

The speed tuning circuit 12 may apply the tuning electrical signals to the sense amplifiers SA and the delay line 10 so as to adjust the timing of their operation to better suit a desired timing. It may be that the memory 12 is functional both before and after such a change, but after operates with a more desirable set of performance characteristics. However, in other embodiments it may he that the memory 2 is such that the normal operation of the transistor before the adjustment to its speed of operation is such that the memory 2 does not operate correctly. In this circumstance, changing the speed of operation of the transistor may change a non-functioning memory into a functioning memory.

As an example, the sense amplifiers SA typically include transistors which should have matched speeds of operation and if these transistors are not matched with an appropriate degree of accuracy, then, for example with differential sense amplifiers, the memory reads may be incorrect at certain target speeds. Adjusting the speed of operation of one of the transistors of such pairs of transistors can bring them closer together in matching their speeds of operation in a manner which then improves reliability and increases the potential operating speed of the memory. Other ways in Which the sense amplifiers may be adjusted is that current sources within the those sense amplifiers which control the slew rate of the sense amplifiers can include transistors which may be targeted by the present techniques. Changing the speed of operation of the transistors within such current sources can adjust the slew rate of the sense amplifiers SA in a manner which can improve the overall performance of the memory 2. In the case of a current sense amplifier the adjustment desired may be to the strength of one of the current sinks so that mismatch is reduced.

Figure 2:
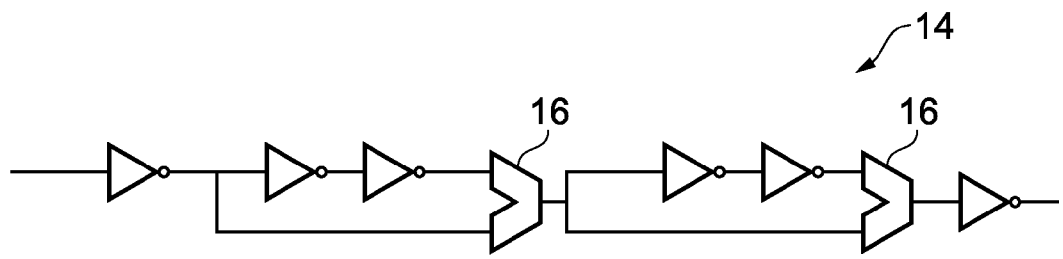
FIG. 2 schematically illustrates a delay line with a selectable delay.

FIG. 2 schematically illustrates a delay line 14 with a selectable delay. In particular, the multiplexers 16 may be used to bypass pairs of inverters and so speed up signal propagation through the delay line 14. Such a programmable delay line can be used to adjust signal timings, but provides a relatively coarse grained adjustment. Furthermore, the selection of the use or non-use of delay line elements is not generally applicable to other circumstances in which it may be desired to change the speed of operation of the transistors.

Figure 3:
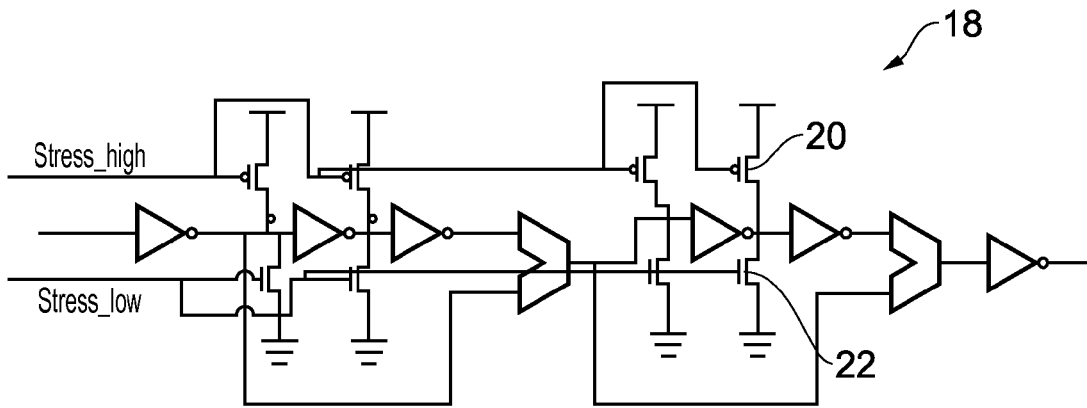
FIG. 3 schematically illustrates a modified version of the delay line of FIG. 2 in which tuning electrical signals may be applied to adjust the speed of operation of transistors within the delay line.

FIG. 3 schematically illustrates a delay line 18 which has been modified to include a portion of the speed tuning circuitry in the form of transistor 20, 22 that apply either a tuning voltage which is above the normal range of voltages (stress high) or a tuning voltage which is below the normal range of voltages (stress low) to the inputs of the inverters within the delay line. The inputs of the inverters are connected to the gates of the transistors within the inverters and accordingly the tuning voltages applied will induce a change in the physical properties of those transistor which will change their switching speed. As the tuning voltage is applied to the single input into the inverter, it will potentially change the speed characteristics of all of the transistors connected to that input.

Figure 4:
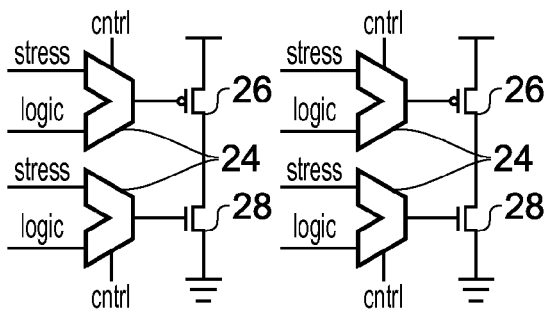
FIG. 4 schematically illustrates transistor stacks in which a tuning electrical signal or a normal electrical signal is applied via a multiplexer to the transistors.

In some embodiments it may be desired to be more selective in the application of the tuning voltage. FIG. 4 schematically illustrates a transistor stack in which multiplexers 24 are used to selectively apply either the normal voltage or a tuning voltage to the gate of the transistors 26, 28. With this embodiment it is possible to adjust the speed of operation of individual transistors during the tuning operation.

Figure 5:
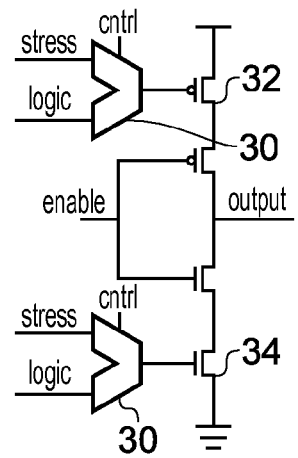
FIG. 5 schematically illustrates a transistor stack in which multiplexers apply either a normal cal signal or a tuning electrical signal to one of the pull up or pull down transistors.

FIG. 5 schematically illustrates a transistor stack in which multiplexers 30 apply either a normal voltage (logic) or a tuning voltage (stress) to the transistors 32, 34 within the stack. Not all of the transistors within the stack need have their switching speed changed in order that the overall speed of operation of the transistor stack is changed.

Figure 6:
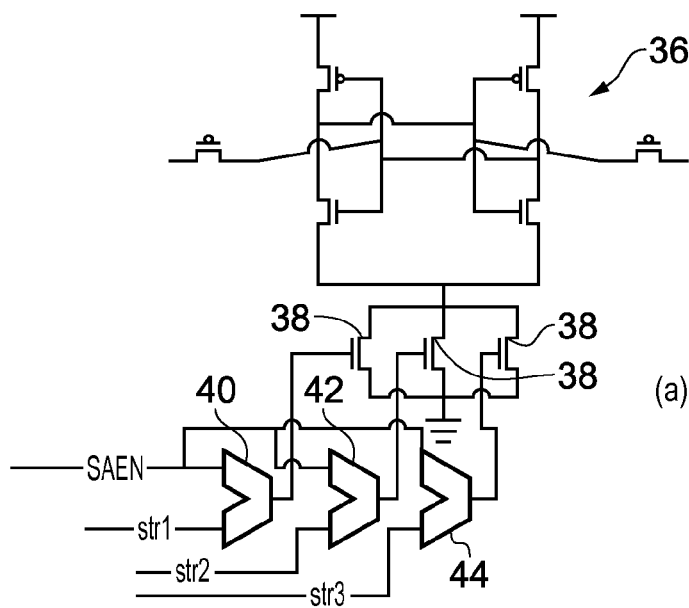
FIG. 6 is a diagram schematically illustrating a sense amplifier from a memory in which a tuning electrical signal is applied to a transistor serving as a current source within the sense amplifier.

FIG. 6 schematically illustrates a sense amplifier 36 including transistors 38 serving as a current source which controls the slew rate of the sense amplifier 36. The switching speed of the transistors 38 may be adjusted using tuning voltages STR1, STR2 and STR3 applied through respective multiplexers 40, 42 and 44. Splitting the current sources into the form of three different transistors and then providing the ability to change the switching speeds of those different transistors 38 permits a fine degree of control to be achieved over the slew rate of the sense amplifier 36.

Figure 7:
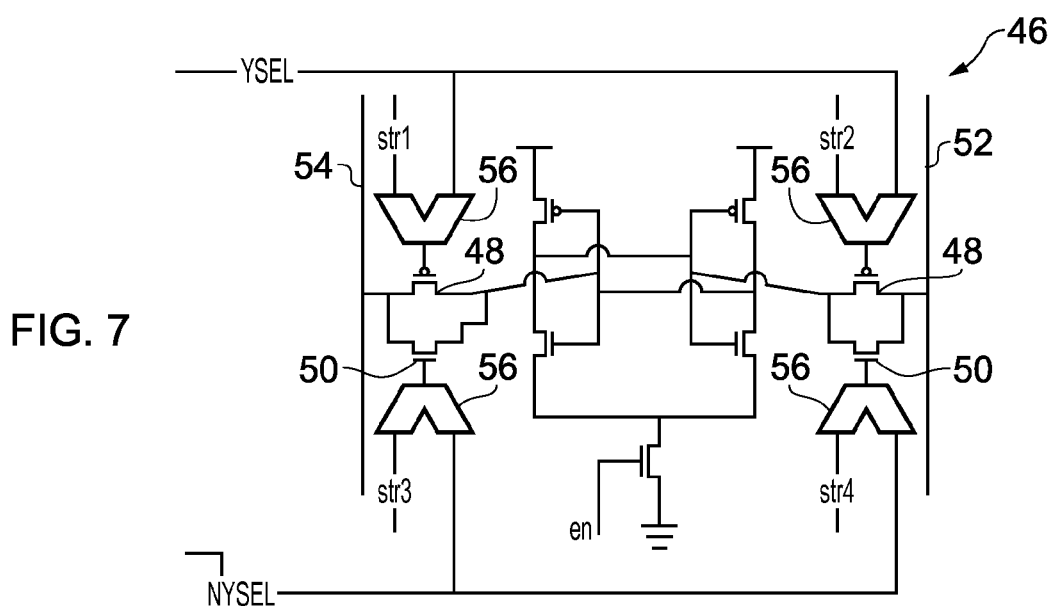
FIG. 7 is a diagram schematically illustrating a sense amplifier in which the tuning electrical signal is applied to adjust the speed of operation of transistors connected to bit lines being sensed.

FIG. 7 schematically illustrates a sense amplifier 46 which includes a pair of PMOS transistors 48 and a pair of NMOS transistors 50 which are used to couple the sense amplifier 46 to the bit lines 52, 54. The pair of PMOS transistors 48 should be matched as should the pair of NMOS transistors 50. The multiplexers 56 may be used to selectively apply tuning voltages to the gates of these transistors 48, 50 to change their switching speeds. In this way, if one of the pairs of transistors 48, 50 is too fast, then its switching speed may be slowed down such that it better matches the other transistor within that pair. In this way a more balanced and sensitive operation of the sense amplifier 46 may be achieved.

The most important devices for matching when sensing bit lines that are precharged high are the NMOS pull down transistors. FIG. 6 shows that the pass gates can be used to drive the internal sense nodes. The cross coupled inverters having both NMOS and PMOS transistors may also be matched using the present techniques and this has a significant effect on performance. If sensing bit lines that are precharged low, then matching the PMOS transistor would be more important, as these would then be the critical sense first devices.

Figure 8:
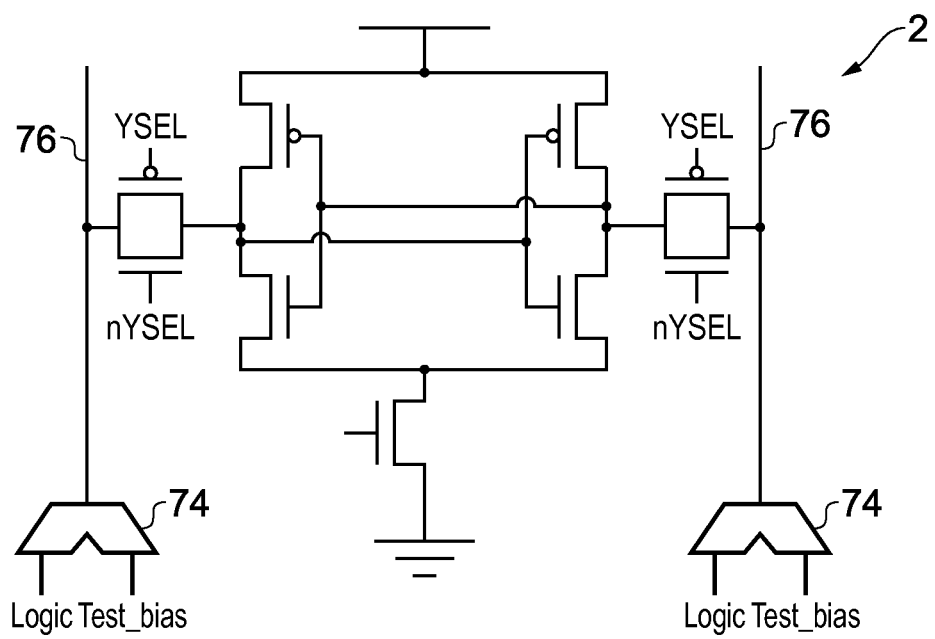
FIG. 8 is a diagram schematically illustrating a sense amplifier in which a test bias is applied to establish a test state from which a switch is made to one of a plurality of stable slates.

FIG. 8 schematically illustrates a sense amplifier circuit 72 which is switched by speed tuning circuitry via multiplexers 74 into a test state by application of a bias signal of a level of $V_{DD}/2$ (Test_bias) that places the bit lines 76 at a point half way between the two stable states of the sense amplifier 72. This introduces an instability in the circuit which is resolved by switching to one of two stable states (i.e. one of the bit lines 76 at $V_{DD}$ and the other at ground). The cross-coupled inverters within the sense amplifier effectively fight with the stronger (faster) prevailing and forcing a corresponding stable state to be adopted. Which stable state is adopted indicates which invertor transistors are the stronger (faster) and this can be read from the sense amplifier output. The speed at which the switch to the stable state is made indicates the degree of mismatch (a faster switch to the stable state indicates a greater degree of mismatch).

In the case of the sense amplifier 72, once the stronger transistor have prevailed the circuit adopts a stable state Which applies a stabilising signal (tuning signal) that ages the stronger transistors and (if left for a sufficient period) slows them down (makes weaker/slower) in a manner that improves the match between the transistors in the invertors of each side of the sense amplifier. This makes the sense amplifier then perform better.

FIGS. 9A and 9B are diagrams schematically illustrating the change in threshold voltage and other characteristics for a transistor when a tuning voltage is applied. As will be seen in FIG. 9A, when a tuning voltage outside the normal range of voltages is applied to that transistor, then a permanent change in the physical properties of that transistor takes place which in turn serves to increase the threshold voltage of that transistor and reduce its saturation current. Increasing the threshold voltage slows the switching speed of the transistor. In this way, the speed of operation of a transistor may be altered by applying a tuning voltage of a desired magnitude. The tuning voltage could be applied in stages with the operation of the integrated circuit checked after each application of the tuning voltage to see if it now met the desired operating characteristics e.g. see FIG. 9B. If the transistor had not had its speed of switching changed sufficiently, then the tuning voltage could be reapplied either at a higher voltage level or for a longer duration in order to achieve the desired change in switching speed, e.g. either using the DC non-stop stress or the AC stress/recover technique.

In many of the examples above, the tuning electrical signal applied has been a tuning voltage outside of the normal range of tuning voltages. It is also possible that in some embodiments the desired change in the physical properties which changes the switching speed may be achieved by applying a voltage within the normal range of voltages, but with a longer duration than is normal. The tuning electrical signal may also be applied to various different ones of the connections to the transistors or combinations of the connections to the transistor. The characteristics of the tuning electrical signal could vary in a variety of different ways from the characteristics of the normal electrical signal. Magnitude and duration are examples, but it is also possible that other effects might be achieved using a tuning electrical signal with other non-standard properties that induce a physical change in the transistor that in turn change its switching speed. Inducing changes through applied currents and/or temperatures is also possible.

In the embodiments of FIGS. 3 to 8, the tuning electrical signal has been provided to the transistor via a dedicated signal path of some form. It is also possible in other embodiments that the tuning electrical signal could be applied reusing the normal signal path. As an example, in the case of a sense amplifier as illustrated in FIG. 7, the tuning electrical signal could be applied to the transistors 48, 50 directly from the signal lines YSEL and NYSEL during tuning operation rather than having to pass via the multiplexers 56. If it was desired to tune the cross-coupled transistors, then stress can be applied to the internal nodes.

Figure 10:
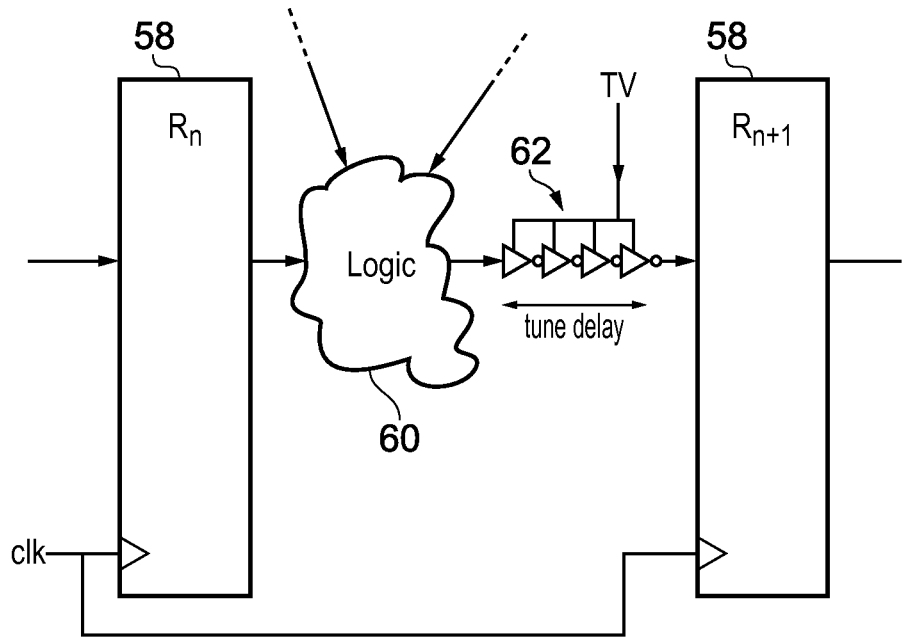
FIG. 10 is a diagram schematically illustrating how the present technique may be used to suppress a race condition in a processing path of an integrated circuit.

FIG. 10 illustrates another example embodiment. In this example embodiment two registers 58 have a signal path including processing logic 60 and a delay line 62 extending therebetween. This signal path is one which is susceptible to a race condition in which the output from the logic 60 reaches the register $R_{n+1}$ too early. The delay line 62 may be subject to a tuning voltage applied thereto to slow down the transistors within the delay line if such a race condition is detected. Slowing down the delay line 62 will render the processing path less susceptible to the race condition.

FIG. 11 is a flow diagram schematically illustrating the use of the present technique. At step 64 the integrated circuit is operated with its normal electrical signals within their normal ranges. At step 66 a determination is made as to whether or not a tuning operation is required. This determination may be based upon the operation of the integrated circuit being a first operational use of that integrated circuit (i.e. a golden boot operation). In other embodiments the determination as to whether or not tuning is required may be based upon the lapse of a predetermined period of time since the last tuning operation (e.g. using a watchdog timing) or the occurrence of some other trigger condition (e.g. an error condition arising indicating that some portion of the circuit is not operating correctly).

The present technique may be applied to the logic 60 to speed up or slow down its operation as desired, i.e. the technique can be applied to in-situ logic and not just delay chains or other timing elements.

If a determination is made that tuning operation is required, then processing proceeds to step 68 where the tuning operation is performed by, for example, applying a tuning voltage to the gate of a transistor which it is desired to slow down. The tuning voltage in other embodiments could be applied to the drain or other terminal of the transistor (e.g. back bias). After the tuning voltage has been applied, a change in the physical properties of the transistor will have occurred and the switching speed of the transistor will, for example, have been reduced. Step 70 then triggers the resuming of normal operation and processing returns to step 64 Where the normal operating voltages are applied to the transistors within the integrated circuit, including the transistor which has had its switching speed slowed.

The above described embodiments relate to the tuning of a normal performance characteristic of a transistor that is switching speed of the transistor upon normal switching of that transistor. Another possible normal performance characteristic Which may be tuned in accordance with the present techniques is a gate capacitance of a transistor. The application of a tuning stimulus, such as a gate voltage outside the normal range of gate voltages, can have the result of increasing the gate capacitance of the transistor permanently or at least semi-permanently (e.g. due to aging). Changing the gate capacitance using a tuning stimulus may be used to modify an integrated circuit from having incorrect operation upon normal switching of the transistor (e.g. switching between its charged and discharged states during which the gate capacitance will control the amount of charge stored on the capacitor) to correct operation upon such normal switching of the transistor. The transistor (possibly configured as a capacitor by using its gate connection as one connection for the capacitor and its source and drain connection joined (shorted) together to form the other connection of the capacitor) switches between a charged state and a discharged state as part of its normal operation with the gate capacitance of the transistor influencing the amount of charge which is stored to and removed from the transistor (configured as a capacitor) during such charging and discharging as part of normal switching operations.

Figure 12:
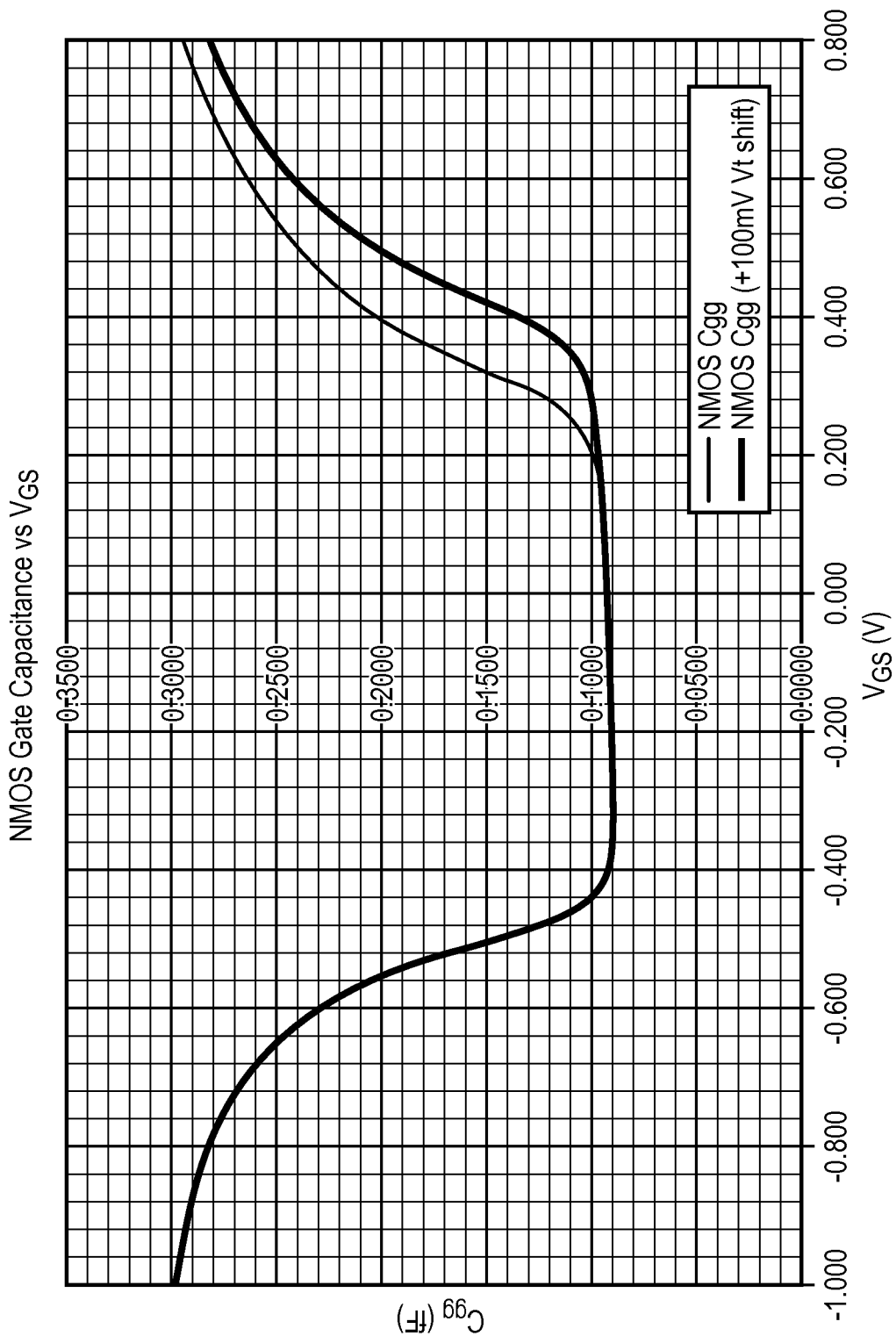
FIG. 12 schematically illustrates a change in gate capacitance when a tuning stimulus is applied to a transistor.

FIG. 12 schematically illustrates how the gate capacitance of an N-type MOSFET transistor may be varied by application of a tuning stimulus. In particular, it will be seen that after application of the tuning stimulus the DC capacitance of the transistor has changed for a given voltage between the gate source when the voltage between the gate and source is greater than the threshold voltage of the transistor. Thus, applying a tuning stimulus which changes the threshold voltage of the transistor has the effect of changing the gate capacitance of the transistor such that when the capacitor is subject to a transient "digital" signal that sweeps from the low logic voltage (e.g. 0V for the case of an NMOS FET transistor) to a high logic voltage VDD; approximately 1V for current technologies), the total charge stored by the capacitor will change since the stored charge is controlled by the relationship Q=CV and this relationship changes for the transistor's operation in the region where the gate source voltage exceeds the threshold voltage. Accordingly, by applying a tuning stimulus Which changes the threshold voltage of the transistor, the amount of charge stored by the transistor (when this is being used a capacitor) can also be changed.

Figure 13:
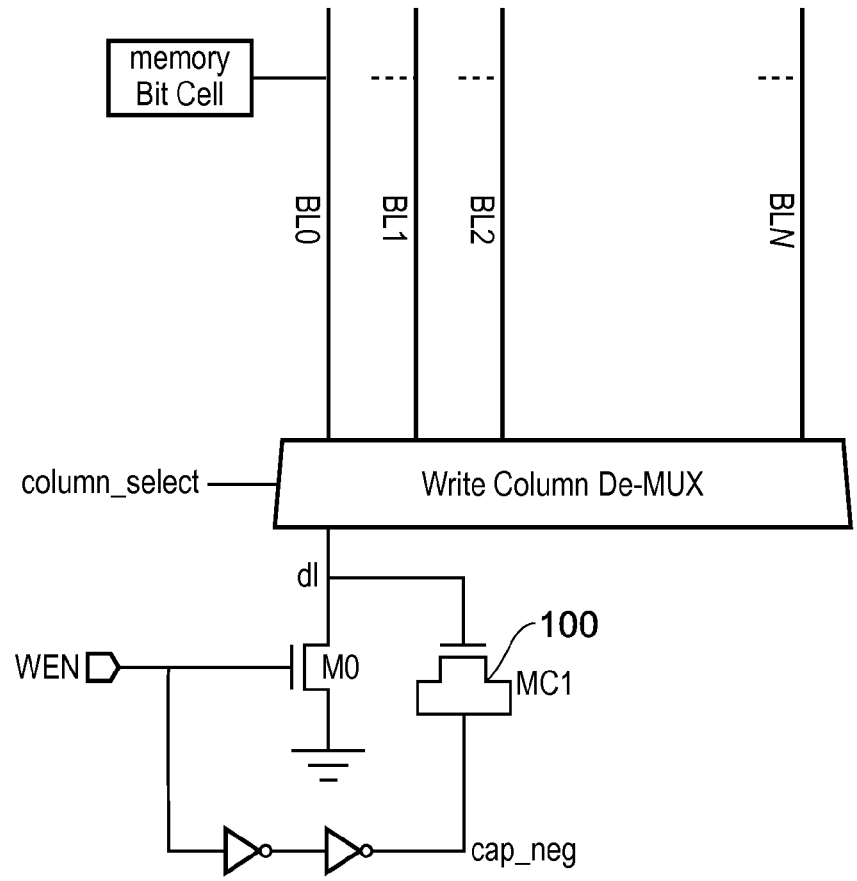
FIG. 13 schematically illustrates a portion of an integrated circuit using a transistor configured as a capacitor in order to provide a write-assist voltage to a memory bit cell.

FIG. 13 schematically illustrates a portion of an integrated circuit comprising circuitry that generates a write-assist voltage during a write operation to a memory bit cell. More particularly, this circuitry utilises a transistor 100 (in the case an N-type MOSFET although other embodiments could use different types of transistor) to serve as a capacitor as part of generating the write-assist voltage. The gate capacitance of this transistor 100 can be changed by applying one of the tuning stimuli previously referred to, such as an out-of-range electrical signal, an increased temperature, an increased current etc. These tuning stimuli may be applied via a multiplexer (not illustrated) via an at least partially dedicated path which is not fully shared with the normal operation signal. The dedicated path for the tuning stimulus electrical signal may share portions with the normal signal, but include dedicated portions and thus applying the tuning stimulus via an overall dedicated path.

It will be understood by those in this technical field that the M-type MOSFET illustrated in FIG. 13 may in practice comprise multiple such transistors arranged in parallel to give the desired degree of charged storage. Furthermore, it will be appreciate that in other embodiments P-type transistors may be used in place of N-type transistors as well as transistors types other than MOSFETs.

FIG. 13 illustrates a single memory bit cell coupled to bit line BL0. In practice a memory will typically contain a large number of such memory bit cells, and each may be connected to a bit line via which a write operation is performed. The write-assist voltage may be used in SRAM bit line lowering schemes, but the present techniques are not limited to this application.

Figure 14:
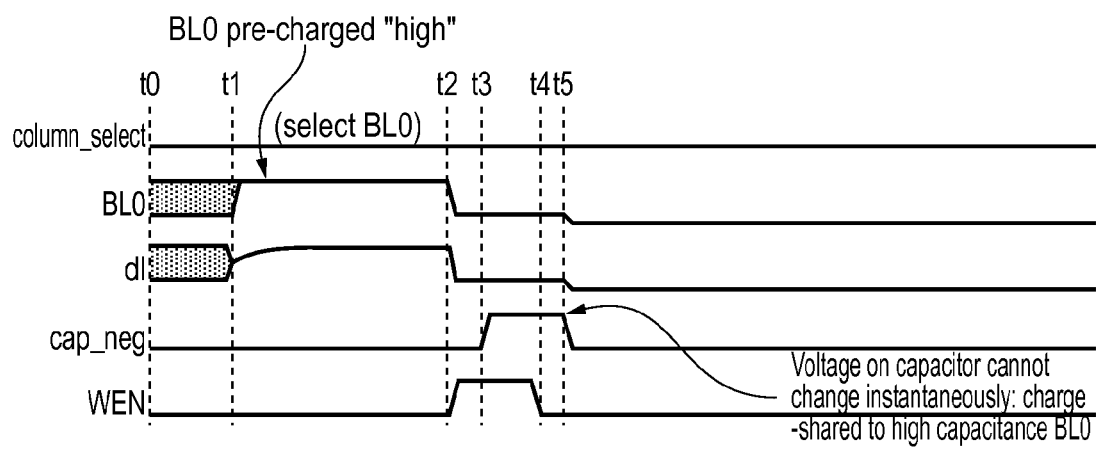
FIG. 14 is a signal diagram schematically illustrating the operation of the circuitry of FIG. 13.

FIG. 14 is a signal diagram schematically illustrating the operation of the circuitry of FIG. 13. At time t1, BL0 is already selected on the "Write Column De-MUX," and so dl is shorted to BL during precharge. Then, sometime later at time t2. WEN is asserted high, which will start to pull down both BL0 and dl. Two inverter delays later, at time t3, the $cap_{13}$ neg signal follows WEN. Then, the WEN signal is released at time t4. Again, $cap_{13}$ neg follows two inverter delays later, but at this point charge has developed across the MOSFET capacitor, MC1 (100). Thus, when $cap_{13}$ neg falls at time t5, the voltage across the capacitor, MC1, cannot change instantaneously, and so the voltage at dl and, consequently, BL, follows and a write-assist voltage is generated.

As shown in FIG. 12, the capacitance of a MOSFET capacitor like MC1 (100) from FIG. 13 can be changed using BTI (bias temperature instability) and shifting the threshold voltage on MC1. Electrical simulations of the circuit from FIG. 13, indicate that a 100 mV shift in the switching threshold voltage Vt produces a 10% change in resulting underdrive voltage (write-assist voltage) that develops on dl and BL0 at time t5 in FIG. 14. This can change the integrated circuit concerned from incorrect operation to correct operation.

In other embodiments the polarity of the MOSFETs involved may be flipped, which can be used to provide a positive boost in voltage above a certain level.

Figure 15:
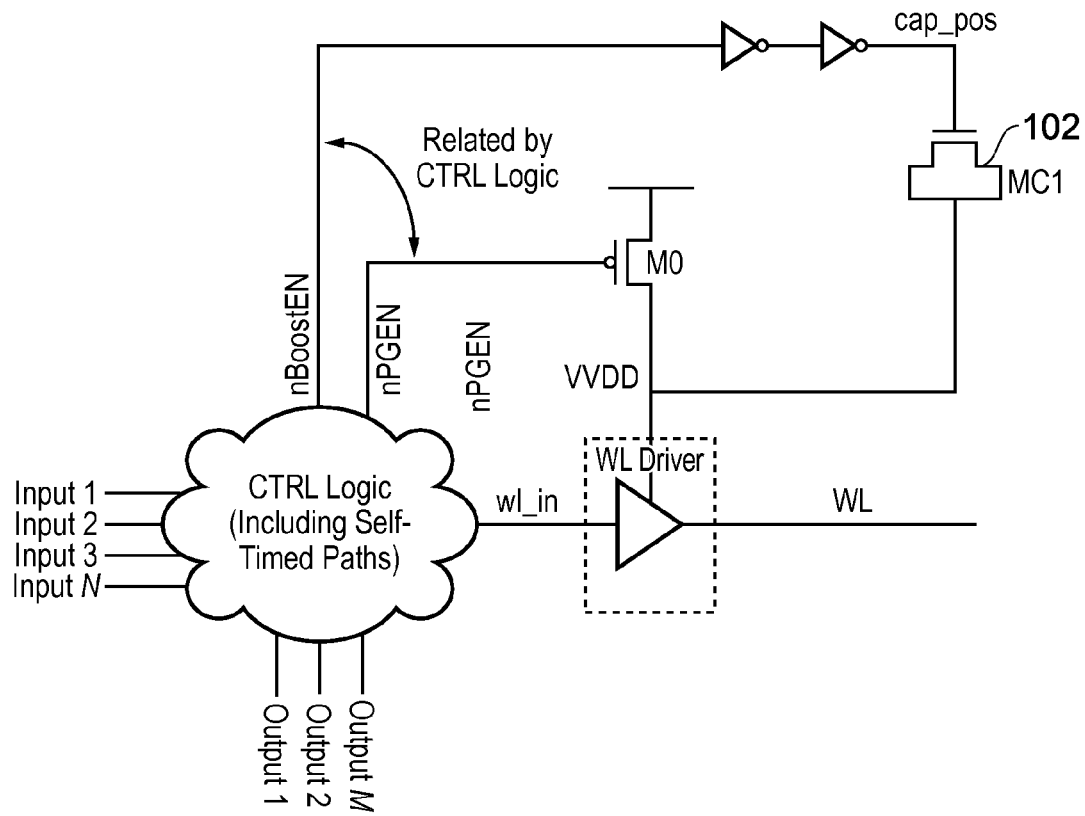
FIG. 15 schematically illustrates a further example of circuitry for generating a write-assist voltage.

A further example of a circuit that uses the present techniques is also concerned with an SRAM assist scheme, i.e. wordline voltage boosting. An abstraction of an example of this type of assist circuitry is shown in FIG. 15. In the circuitry of FIG. 15, the control logic is shown as a logic bubble and can accept a number of different types of inputs (decoders, dummy bit lines, etc). This control logic can also control a variable number of circuits with its outputs. One of the circuits it can control is a circuit for providing word line boosting. A transistor 102 is configured to be used as a capacitor. The capacitance of this transistor 102 may be adjusted using a tuning stimulus as previously described. Depending upon the capacitance of the transistor 102, there will be a different amount of charge stored by the transistor 102 and accordingly a difference in the amount of charge needed to switch the transistor 102 between its charge state and its discharged state during its normal switching operations. This results in different amounts of word line boosting and change the integrated circuit from incorrect operation to correct operation.

Figure 16:
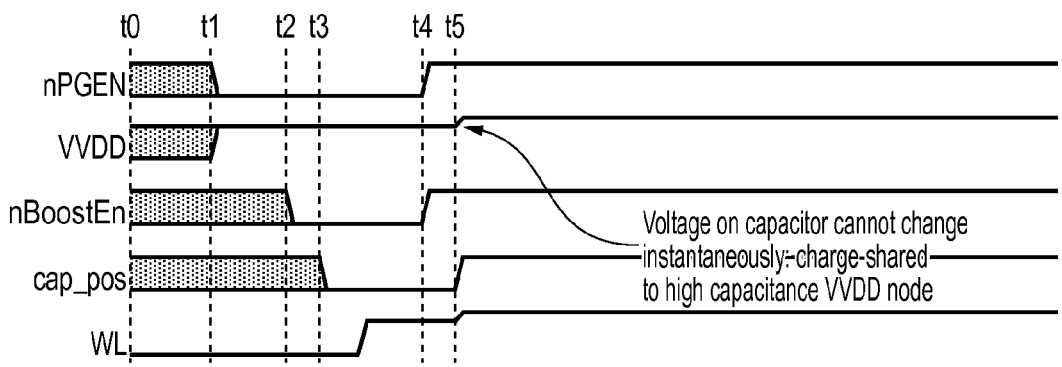
FIG. 16 is a signal diagram schematically illustrating the operation of the circuitry of FIG. 15.

FIG. 16 is a timing diagram schematically illustrating the operation of the circuitry of FIG. 15. FIG. 16 is similar to FIG. 14, but the polarities are switched for boosting and the MOSFET capacitor 102. This result in the word line voltage WL being driven to a higher level than the standard VDD voltage level.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   at least one transistor having a plurality of electrical connections and a normal performance characteristic controlled by one or more physical properties of said transistor, said normal performance characteristic arising during normal operations of said transistor that apply normal electrical signals within respective normal ranges to at least some of said plurality of electrical connections of said transistor, said normal performance characteristic having a value resulting in incorrect operation of said integrated circuit upon normal switching of said transistor; and
   a tuner configured to apply during a tuning operation a tuning stimulus to a gate of said transistor to permanently change at least one of said one or more physical properties of said transistor that control said normal performance characteristic such that upon resuming modified normal operations with said normal electrical signals said transistor operates with a changed normal performance characteristic, said changed normal performance characteristic having a value resulting in correct operation of said integrated circuit upon normal switching of said transistor.

2. An integrated circuit as claimed in claims 1, wherein said one or more physical properties of said transistor comprise a switching threshold voltage of said transistor.

3. An integrated circuit as claimed in claim 1, wherein said normal performance characteristic comprises switching speed of said transistor.

4. An integrated circuit as claimed in claim 1, wherein said normal performance characteristic comprises gate capacitance of said transistor.

5. An integrated circuit as claimed in claim 1, wherein said tuner applies a tuning electrical signal having at least one of:
   a current level outside said corresponding one of said normal ranges; and
   a duration outside said corresponding one of said normal ranges.

6. An integrated circuit as claimed in claim 1, wherein said transistor has a drain connection and said tuner applies tuning electrical signal to said drain connection.

7. An integrated circuit as claimed in claim 6, wherein said performance characteristic is switching speed and said switching speed is increased by said application of said tuning electrical signal.

8. An integrated circuit as claimed in claim 1, wherein said transistor has a back bias connection and said tuner applies a tuning electrical signal to said back bias connection.

9. An integrated circuit as claimed in claim 1, wherein said integrated circuit includes a memory having a sense amplifier and said transistor is a current source transistor configured to control a slew rate of said sense amplifier.

10. An integrated circuit as claimed in claim 3, wherein said integrated circuit includes a delay line configured to generate a control signal with a delay timing and said transistor is part of said delay line such that changing said switching speed of said transistor changes said delay timing.

11. An integrated circuit as claimed in claim 3, wherein said integrated circuit includes a transistor stack configured to generate an output signal pulled up to a first voltage level or pulled down to a second voltage level in dependence upon an input signal and said transistor is part of said transistor stack such that changing said switching speed of said transistor changes at least one of a speed at which said output signal is pulled up or pulled down.

12. An integrated circuit as claimed in claim 3, wherein said integrated circuit includes a signal path susceptible to a race condition error and said transistor is part of said signal path such that slowing switching of said transistor suppresses occurrence of said race condition.

13. An integrated circuit as claimed in claim 1, wherein said tuner includes a multiplexer coupled to said at least one of said plurality of connections and configured to supply a tuning electrical signal thereto during said tuning operation and to apply a corresponding normal electrical signal thereto during said normal operation.

14. An integrated circuit as claimed in claim 13, wherein said tuning electrical signal is applied via a dedicated signal path.

15. An integrated circuit as claimed in claim 4, wherein said transistor is configured to serve as a capacitor and is switched between a charging state and a discharging state.

16. An integrated circuit as claimed in claim 15, wherein a magnitude of charge stored by said capacitor in said charging state is dependent upon said gate capacitance of said transistor and said tuner is configured to change said gate capacitance.

17. An integrated circuit as claimed in claim 15, comprising a memory bit cell and wherein said capacitor is configured to provide a write-assist voltage during a write operation to said memory bit cell.

18. An integrated circuit as claimed in claim 15, wherein said tuner changes said gate capacitance of said transistor so as to change a magnitude of said write-assist voltage.

19. An integrated circuit as claimed in claim 4, wherein
   said transistor has a gate connection, a source connection and a drain connection,
   said transistor is configured to serve as a capacitor having a first connection and a second connection,
   said gate connection provides said first connection of said capacitor,
   said drain connection and said source connection are connected together and provide said second connection,
   said normal switching operation comprises switching between applying a first bias between said first connection and said second connection to charge said capacitor and applying a second bias between said first connection and said second connection to discharge said capacitor, and said first bias is a reverse bias and said second bias is substantially zero bias.

20. An integrated circuit comprising:

at least one transistor means for performing a switching operation, said transistor means having a plurality of electrical connections and a normal performance characteristic controlled by one or more physical properties of said transistor means, said normal performance characteristic arising during normal operations of said transistor means that apply normal electrical signals within respective normal ranges to at least some of said plurality of electrical connections of said transistor means, said normal performance characteristic having a value resulting in incorrect operation of said integrated circuit upon normal switching of said transistor means; and tuner means for applying during a tuning operation a tuning stimulus to a gate of said transistor means to permanently change at least one of said one or more physical properties of said transistor means that control said normal performance characteristic such that upon resuming modified normal operations with said normal electrical signals said transistor means operates with a changed normal performance characteristic, said tuner means being coupled to said transistor means, and said changed normal performance characteristic having a value resulting in correct operation of said integrated circuit upon normal switching of said transistor means.

21. A method of tuning operation of an integrated circuit including at least one transistor having a plurality of electrical connections and a normal performance characteristic controlled by one or more physical properties of said transistor, said normal performance characteristic arising during normal operations of said transistor that apply normal electrical signals within respective normal ranges to at least some of said plurality of electrical connections of said transistor, said normal performance characteristic having a value resulting in incorrect operation of said integrated circuit upon normal switching of said transistor; said method comprising the step of:

applying during a tuning operation a tuning stimulus to a gate of said transistor to permanently change at least one of said one or more physical properties of said transistor that control said normal performance characteristic such that upon resuming modified normal operations with said normal electrical signals said transistor operates with a changed normal performance characteristic, said changed normal performance characteristic having a value resulting in correct operation of said integrated circuit upon normal switching of said transistor.

* * * * *